US008330092B2

(12) United States Patent
Martin et al.

(10) Patent No.: US 8,330,092 B2
(45) Date of Patent: Dec. 11, 2012

(54) SNAPSHOT PIXEL CIRCUIT FOR MINIMIZING LEAKAGE CURRENT IN AN IMAGING SENSOR HAVING A TWO-POLE INTEGRATION SWITCH

(75) Inventors: Peter Martin, Haiku, HI (US); Paul Johnson, El Cajon, CA (US); Chris Sexton, San Diego, CA (US)

(73) Assignee: Trex Enterprises Corp, San Diego, CA (US)

( * ) Notice: Subject to any disclaimer, the term of this patent is extended or adjusted under 35 U.S.C. 154(b) by 430 days.

(21) Appl. No.: 12/658,271

(22) Filed: Feb. 9, 2010

(65) Prior Publication Data

US 2010/0201431 A1 Aug. 12, 2010

Related U.S. Application Data

(60) Provisional application No. 61/207,186, filed on Feb. 9, 2009.

(51) Int. Cl.
*H01J 40/14* (2006.01)

(52) U.S. Cl. .................. 250/214 R; 250/208.1
(58) Field of Classification Search .............. 250/208.1, 250/214 R, 214.1; 257/290–294, 440–444; 348/302–310
See application file for complete search history.

(56) References Cited

U.S. PATENT DOCUMENTS 6,369,853 B1 * 4/2002 Merrill et al. ............. 348/302

* cited by examiner

*Primary Examiner* — Que T Le
(74) *Attorney, Agent, or Firm* — John R. Ross (57) ABSTRACT

Pixel circuits, capable of operating in either "snapshot" or "rolling integration" mode, and compatible with a conformal photodiode coating. Preferred embodiments of the present invention are compatible with these coating materials, as well as others, including amorphous Silicon. The preferred pixel circuits includes additional transistors not provided in prior art pixel circuits to divert leakage current away from integration nodes when not integrating, to reset the integration node, and to buffer and select the integrated voltage.

2 Claims, 7 Drawing Sheets

SNAPSHOT PIXEL CIRCUIT FOR MINIMIZING LEAKAGE CURRENT IN AN IMAGING SENSOR HAVING A TWO-POLE INTEGRATION SWITCH

CROSS-REFERENCE TO RELATED APPLICATIONS

This application claims the benefit of provisional patent application Ser. No. 61/207,186 filed Feb. 9, 2009.

BACKGROUND OF THE INVENTION

Applicants and their fellow workers have developed the Photoconductor on Active Pixel (POAP) image sensor technology for the last decade. Examples of these sensors are provided in U.S. Pat. Nos. 6,730,914, 7276,749 and 7,436,038 all of which are incorporated herein by reference. They have developed an amorphous silicon (a-Si:H) p-i-n photodiode coating (0.4 micron-0.7 micron spectrum). This photodiode coating is deposited on a pixelated CMOS readout array for visible imaging applications. Applicants are presently developing a microcrystalline germanium (µc-Ge) p-i-n photodiode coating (0.4 micron-1.6 micron spectrum). This photodiode coating is deposited on a pixelated CMOS readout array for visible (VIS), near infrared (NIR) and short wave infrared (SWIR) imaging applications. U.S. Pat. No. 6,730,914 teaches the use of direct injection pixel circuits for POAP image sensor applications.

SUMMARY OF THE INVENTION

Applicants' experiments have shown that microcrystalline germanium photodiode coatings and microcrystalline silicon photodiode coatings produce relatively very high leakage currents. And that prior art pixel circuits are not compatible with these microcrystalline photodiode coatings. The present invention provides pixel circuits, capable of operating in either "snapshot" or "rolling integration" mode, and compatible with a conformal photodiode coating. Preferred embodiments of the present invention are compatible with these coating materials, as well as others, including amorphous Silicon. The preferred pixel circuits includes additional transistors not provided in prior art pixel circuits to divert leakage current away from integration nodes when not integrating, to reset the integration node, and to buffer and select the integrated voltage.

In a first preferred embodiment, a six transistor (6T) circuit with five control lines, can provide conventional (i.e. kTC-noise limited) snapshot integration-then-read (ITR) capability, and also off-chip correlated double sampling (CDS) capability. In a second preferred embodiment, an eight transistor (8T) circuit with seven control lines, can provide conventional (i.e. kTC-noise limited) snapshot integration-then-read (ITR) capability and integrate-while-read (IWR) capability; and also off-chip correlated double sampling (CDS) capability.

The advantages of the first preferred embodiment are: less control lines (5 versus 7) routed to each pixel, less circuitry in a relatively small pixel (6 MOSFETS and one capacitor versus 8 MOSFETS and two capacitors), and lower readout noise. The additional circuitry and control lines required for the second preferred embodiment may require a pixel size larger than 6 microns×6 microns to accommodate but may also further reduce noise.

DETAILED DESCRIPTION OF PREFERRED EMBODIMENTS

Pixel Circuit #1

Figure 1:
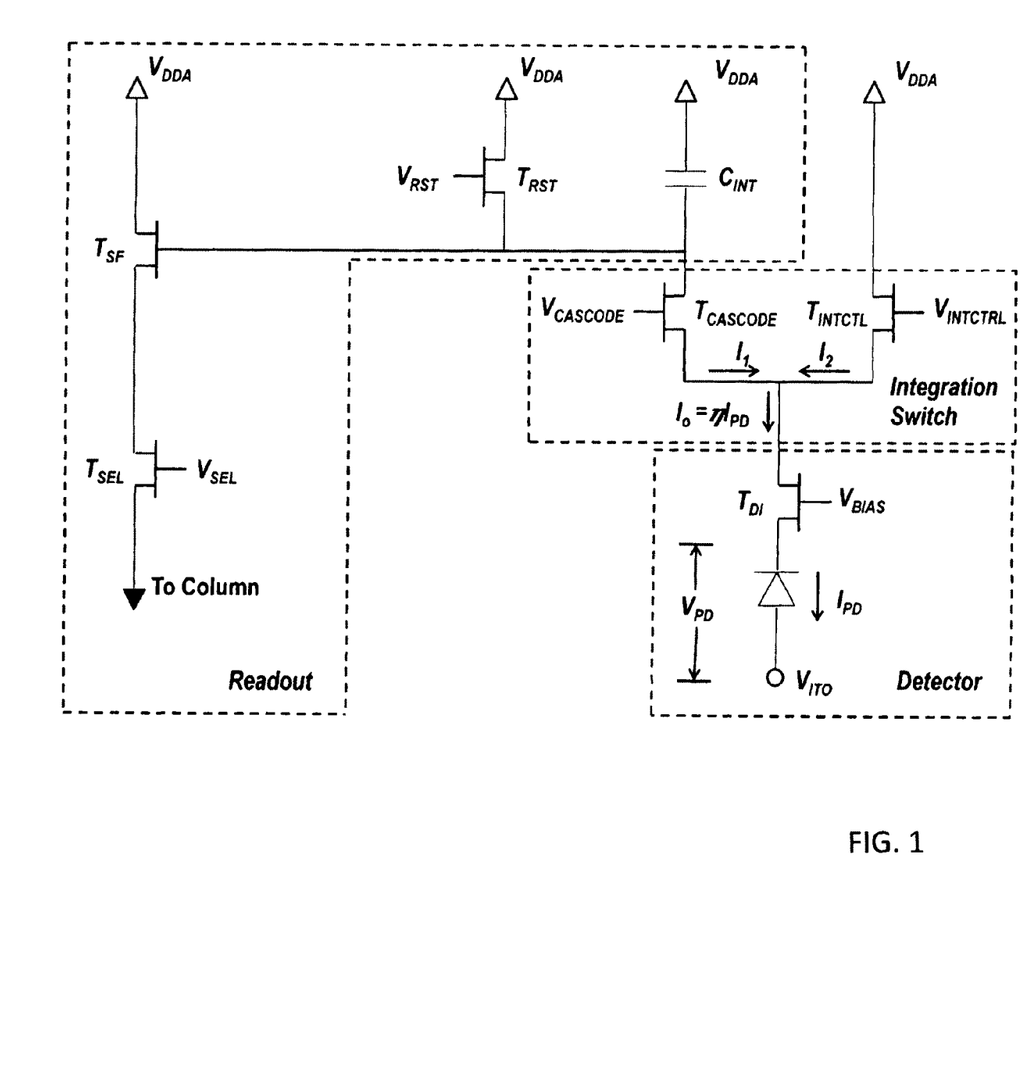
FIG. 1 is a drawing of a pixel circuit of the present invention.

Pixel Circuit #1, displayed in FIG. 1, includes the POAP photodiode, six MOSFETs, an integration capacitor, and five control lines. This circuit is designed to collect electrons (versus holes) from the photodiode. A direct injection input circuit interfaces with the POAP photodiode coating and attempts to maintain the voltage across the photodiode at a constant value. An integration switch controls the snapshot integration time. The integration capacitor collects electric charge from the photodiode. When the row readout select switch is closed, a source follower trans-impedance amplifier provides a current that is proportional to the collected charge. This current is directed to the periphery of the pixel array for amplification, digitization, and digital readout. The row reset switch, when closed, dumps the integrated charge and resets the voltage across the integration capacitor to zero. This pixel circuit can provide 1) snapshot integrate-then-read capability whereby all pixels in the array integrate at the same time over a period $T_{INT}$ followed by progressive row readout of the stored pixel charges, 2) rolling reset integration capability, and 3) off-chip CDS readout capability.

The pixel circuit can be divided into three sub-circuits; detector, integration switch, and readout sub-circuits. The basic operation of this pixel circuit is described here.

Detector

The detector sub-circuit ("Detector") includes the POAP photodiode and the direct injection transistor $T_{DI}$. This circuit attempts to hold the voltage across the photodiode, $V_{PD}$, at a constant value, independent of the integrated charge on the capacitor $C_{INT}$. This enables photodiode operation at a bias voltage that attempts to minimize dark current from the photodiode.

The injection efficiency η of the photodiode current through transistor $T_{DI}$, dependent on the relative values (current divider) of the shunt resistance of the photodiode and the input impedance of transistor $T_{DI}$, is $$\eta = \frac{I_o}{I_{PD}} = \frac{R_{shunt}}{R_{shunt} + 1/g_m}$$

$$\text{where } g_m = \frac{qI_{photodiode}}{nkT}$$

and $$n = 1.5 \text{ to } 4$$

We can approximate the shunt resistance of our photodiode as $$R_{shunt} = \frac{1 \text{ Volt}}{I_{dark@-1V\ bias}}$$

Figure 2:
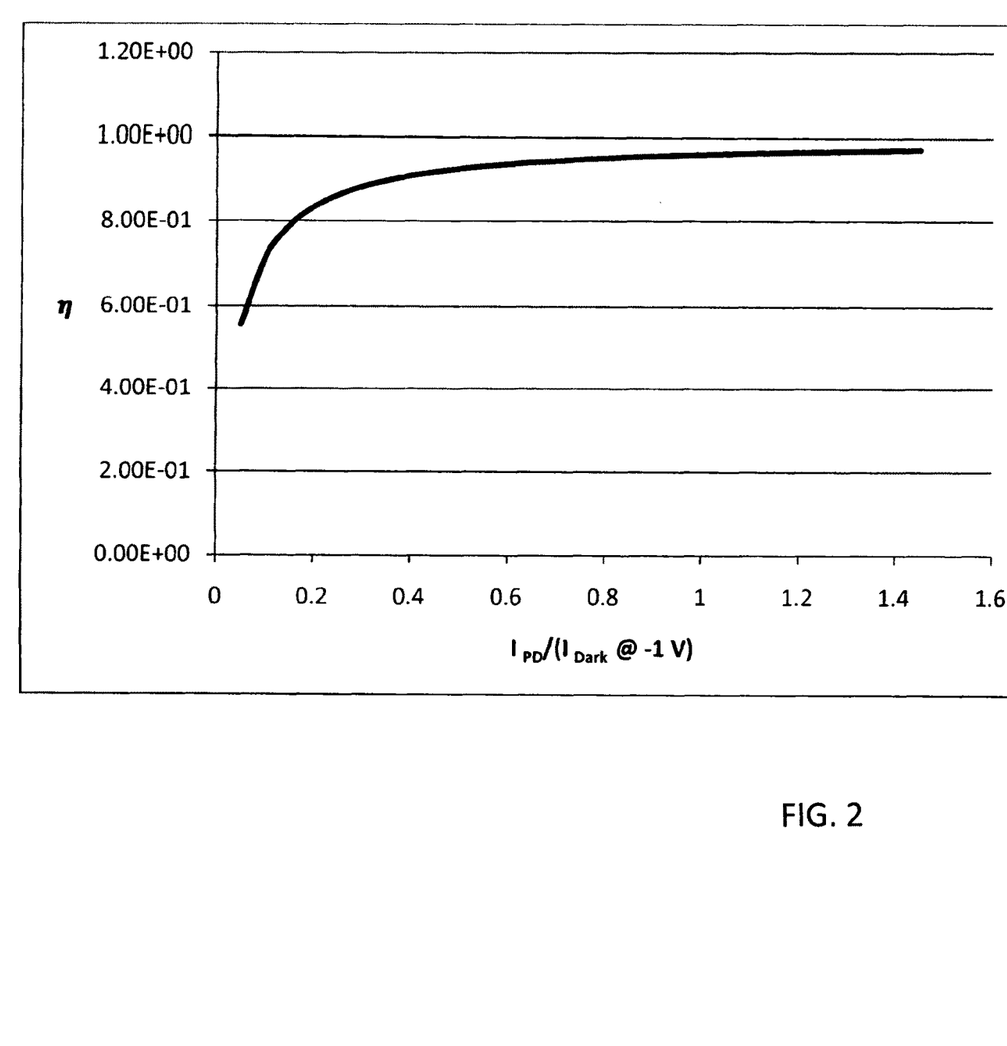
FIG. 2 shows injection efficiency versus a current ratio.

The injection efficiency η versus $I_{PD}/I_{dark}$@−1 V bias is displayed in FIG. 2.

Integration Switch

The integration switch sub-circuit includes the two transistors $T_{INTCTL}$ and $T_{CASCODE}$. The differential gate voltage, $\Delta V_{INT} = V_{INTCTL} - V_{CASCODE}$ controls the current $I_o = I_1 + I_2$ flowing through the two paths of the switch.

$$I_1 = \frac{I_o}{2} + \frac{\Delta V_{INT}}{2}\sqrt{\beta I_o}\left(1 - \frac{\left(\frac{\Delta V_{INT}}{2}\right)^2}{I_o/\beta}\right)^{1/2}$$

and $$I_2 = \frac{I_o}{2} - \frac{\Delta V_{INT}}{2}\sqrt{\beta I_o}\left(1 - \frac{\left(\frac{\Delta V_{INT}}{2}\right)^2}{I_o/\beta}\right)^{1/2}$$

Figure 3:
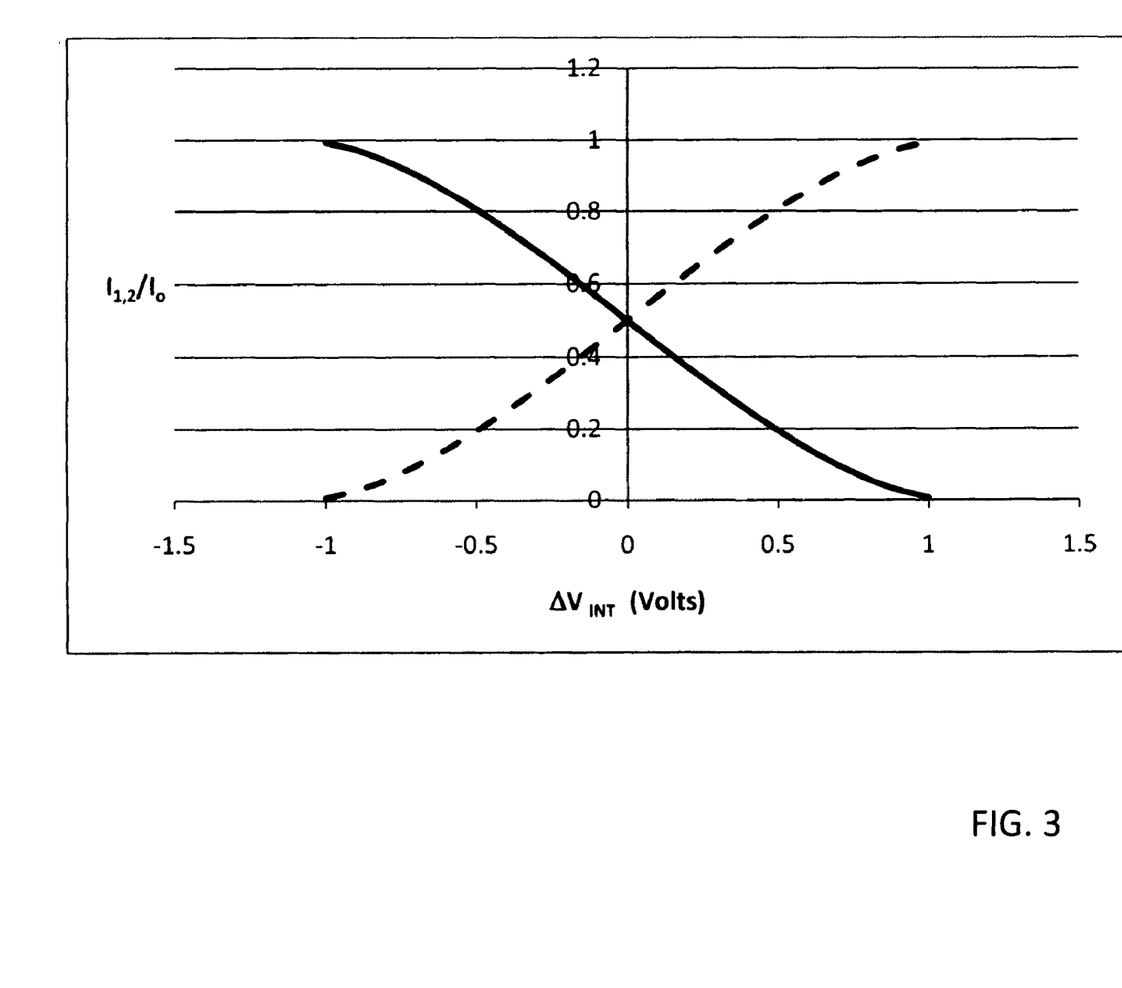
FIG. 3 describes current flowing in two paths.

The currents $I_1/I_o$ and $I_2/I_o$ versus $\Delta V_{INT}$ are displayed in FIG. 3.

Readout Circuit

The readout sub-circuit includes the integration capacitor $C_{INT}$, the source follower transistor $T_{SF}$, the select transistor $T_{SEL}$, and the reset transistor $T_{RST}$. The integration capacitor $C_{INT}$ collects electric charge from the photodiode. When the select switch $T_{SEL}$ is closed, the source follower transistor $T_{SF}$ (trans-impedance amplifier) provides a current that is proportional to the collected charge on $C_{INT}$. This current is directed to the periphery of the pixel array for amplification, digitization, and digital readout. The reset switch $T_{RST}$, when closed, dumps the integrated charge on $C_{INT}$ and resets the voltage across $C_{INT}$ to zero.

Snapshot Integration

Integration-Then-Read

Figure 4:
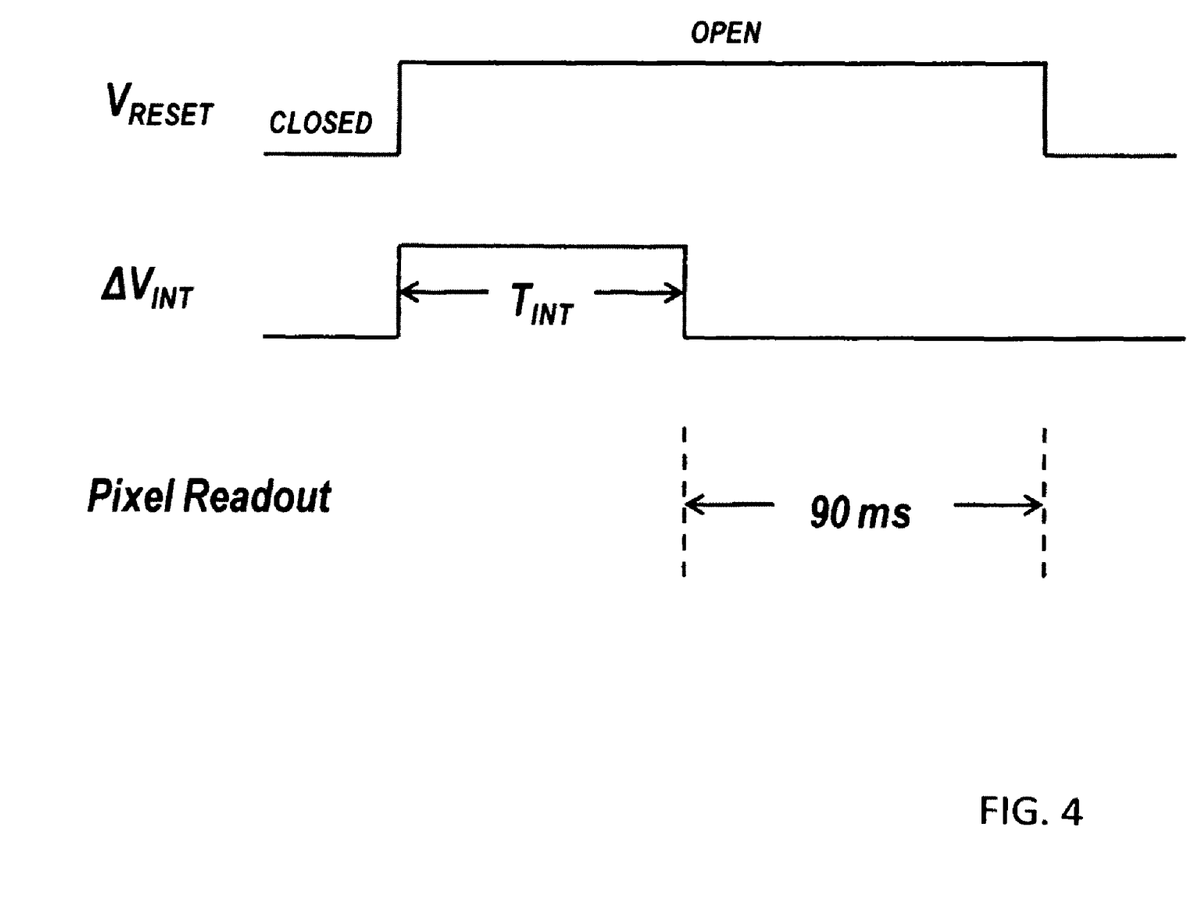
FIG. 4 shows and integration sequence.

The snapshot integration readout sequence for Pixel Circuit #1 is displayed in FIG. 4. The reset switch $T_{RST}$ is opened, then the integration switch is opened ($\Delta V_{INT} = V_{INTCTL} - V_{CASCODE} = 1$ V) to enable the photodiode current $I_o$ to flow to the integration capacitor $C_{INT}$. After an integration time $T_{INT}$, the integration switch is closed ($\Delta V_{INT} = V_{INTCTL} - V_{CASCODE} = -1$ V) to stop collection of charge on the integration capacitor $C_{INT}$ and to direct the photodiode current $I_o$ directly to the power supply. The charges on all of the pixels are then progressively readout row-by-row (approximately 90 ms readout time for a 14 kpixel×14 kpixel sensor). The charge values are digitized and stored off-chip.

Rolling Reset Integration

The rolling reset integration mode for Pixel Circuit #1 is implemented by keeping the integration switch always opened ($\Delta V_{INT} = V_{INTCTL} - V_{CASCODE} = 1$ V) to enable the photodiode current $I_o$ to flow continuously to the integration capacitor $C_{INT}$. The rolling reset integration is then implemented in the same manner as a conventional 3T (source follower transistor $T_{SF}$, select transistor $T_{SEL}$ and reset transistor $T_{RST}$) pixel circuit.

Correlated Double Sampling Integration

Figure 5:
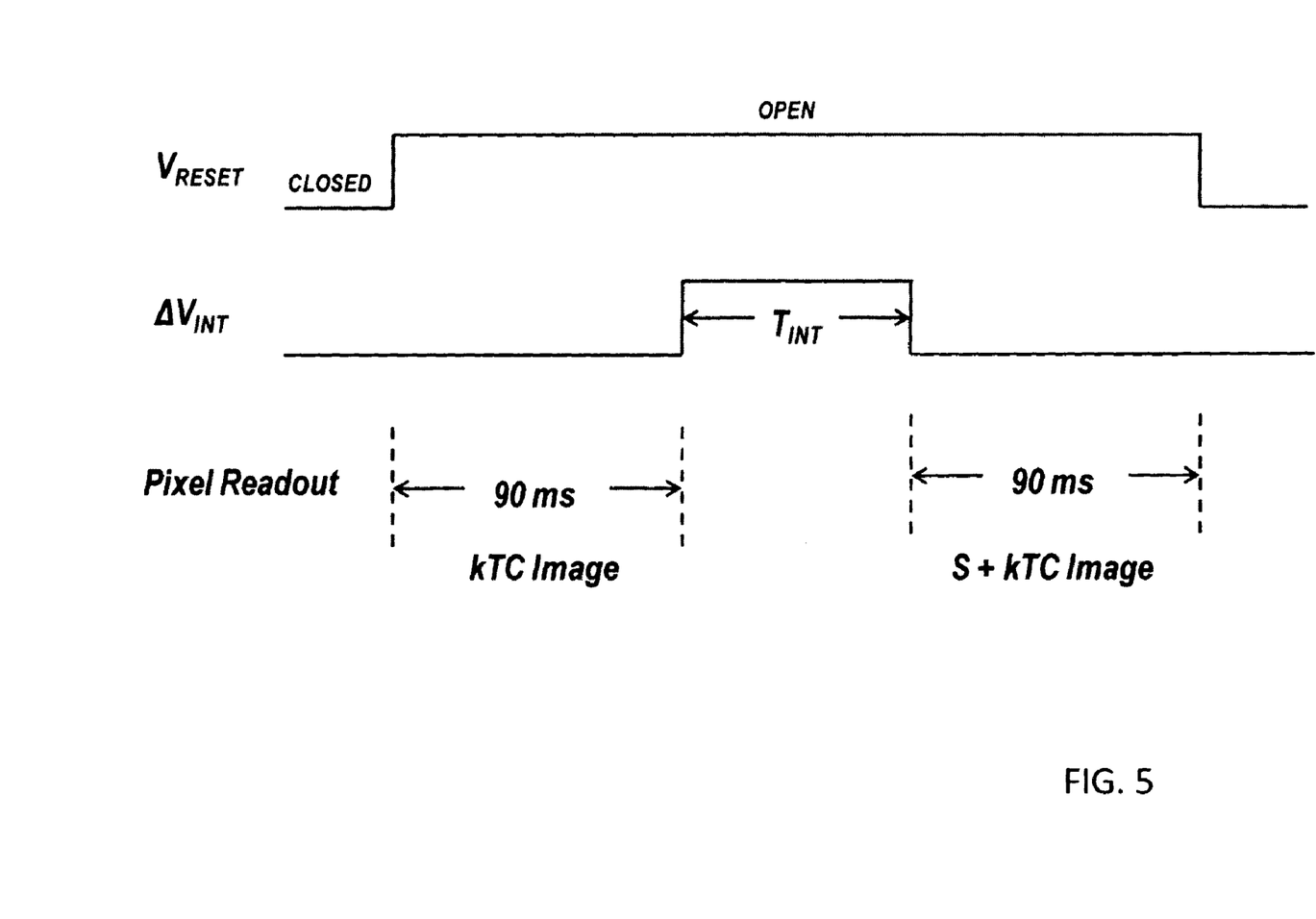
FIG. 5 shows and off-chip readout sequence.

Pixel Circuit #1 can also provide off-chip CDS readout, displayed in FIG. 5. The reset switch $T_{RST}$ is opened, while keeping the integration switch closed ($\Delta V_{INT} = V_{INTCTL} - V_{CASCODE} = -1$ V). The initial charge on the integration capacitor $C_{INT}$ (after opening the reset switch $T_{RST}$) is the kTC (switching noise) charge (randomly different on each pixel). The kTC charges on all of the pixels are progressively readout row-by-row, digitized, and stored off-chip. Then the integration switch is opened ($\Delta V_{INT} = V_{INTCTL} - V_{CASCODE} = 1$ V) to enable the photodiode current $I_o$ to flow to the integration capacitor $C_{INT}$. After an integration time $T_{INT}$, the integration switch is closed ($\Delta V_{INT} = V_{INTCTL} - V_{CASCODE} = -1$ V) to stop collection of charge on the integration capacitor $C_{INT}$ and to direct the photodiode current $I_o$ directly to the power supply. The final charge on each pixel is the signal (S) plus kTC charge. The charges S+kTC on all of the pixels are then progressively readout row-by-row, digitized, and stored off-chip. The two pixel images S+kTC and kTC are then digitally subtracted (S+kTC−kTC=S) to provide an image with the kTC noise removed.

Pixel Circuit #2

Alternate Embodiment

Figure 6:
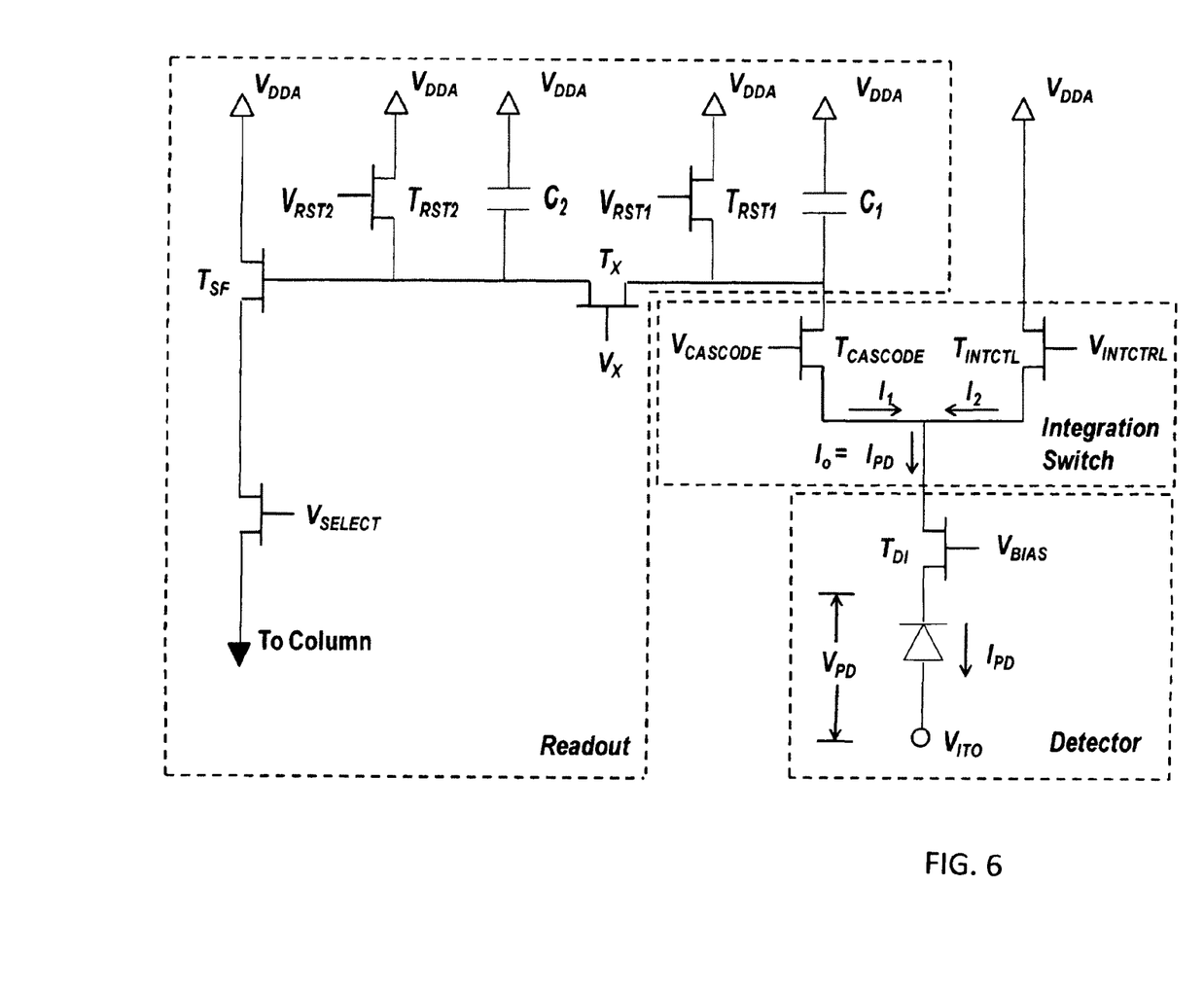
FIG. 6 shows a pixel circuit including a photodiode and additional features.

Pixel Circuit #2, displayed in FIG. 6, includes the POAP photodiode, eight MOSFETs, an integration capacitor, and seven control lines. This circuit is designed to collect electrons (versus holes) from the photodiode. A direct injection input transistor $T_{DI}$ interfaces with the POAP photodiode coating and attempts to maintain the voltage across the photodiode at a constant value. An integration switch ($T_{INTCTL}$ and $T_{CASCODE}$) controls the snapshot integration time. Two integration capacitors C1 and C2 collect electric charge from the photodiode. When the row readout select switch $T_{SEL}$ is closed, a source follower trans-impedance amplifier $T_{SF}$ provides a current that is proportional to the collected charge. This current is directed to the periphery of the pixel array for amplification, digitization, and digital readout. The row reset switches $T_{RST1}$ and $T_{RST2}$ when closed, dump the integrated charge and resets the voltage across the integration capacitors C1 and C2 to zero. This pixel circuit can provide 1) snapshot integrate-then-read capability whereby all pixels in the array integrate on capacitors C1 and C2 (transfer gate open) at the same time over a period $T_{INT}$ followed by progressive row readout of the stored pixel charges, 2) snapshot integrate-while-read capability whereby all pixels in the array integrate on capacitor C1 (transfer gate $T_X$ closed) at the same time over a period $T_{INT}$, followed by a transfer of charge (transfer gate $T_X$ open) from capacitor C1 to capacitor C2, followed by progressive row readout of the stored pixel charges on capacitor C2, 3) rolling reset integration capability, and 4) off-chip CDS readout capability.

Pixel Circuitry

Pixel Circuit #2 is essentially the same as Pixel Circuit #1, with the addition of a transfer gate $T_X$ and a second integration/charge storage capacitor C2.

Snapshot Integration

Integrate-Then-Read

The snapshot integration readout sequence for Pixel Circuit #2, displayed in FIG. 4, is essentially the same as for Pixel #1. The transfer gate $T_X$ is kept always open for this integration mode. The reset switches $T_{RST1}$ and $T_{RST1}$ are opened, then the integration switch is opened ($\Delta V_{INT} = V_{INTCTL} - V_{CASCODE} = 1$ V) to enable the photodiode current $I_o$ to flow to the integration capacitors C1 and C2. After an integration time $T_{INT}$, the integration switch is closed ($\Delta V_{INT}=V_{INTCTL}-V_{CASCODE}=-1$ V) to stop collection of charge on the integration capacitors C1 and C2 and to direct the photodiode current $I_o$ directly to the power supply. The charges on all of the pixels are then progressively readout row-by-row (approximately 90 ms readout time for a 14 kpixel×14 kpixel sensor). The charge values are digitized and stored off-chip.

Snapshot Integration Integrate-While-Read

The reset switch $T_{RST1}$ is opened, then the integration switch is opened ($\Delta V_{INT}=V_{INTCTL}-V_{CASCODE}=1$ V) to enable the photodiode current $I_o$ to flow to the integration capacitor C1. After an integration time $T_{INT}$, the integration switch is closed ($\Delta V_{INT}=V_{INTCTL}-V_{CASCODE}=-1$ V) to stop collection of charge on the integration capacitor C1 and to direct the photodiode current $I_o$ directly to the power supply. The transfer gate $T_X$ is then opened to allow one half of the charge on capacitor C1 to flow to capacitor C2 (i.e. the two capacitor voltages will equalize). The transfer gate $T_X$ is then closed. The charges on capacitors C2 on all of the pixels are then progressively readout row-by-row (approximately 90 ms readout time for a 14 kpixel×14 kpixel sensor). The charge values are digitized and stored off-chip. During this readout period, the pixel can integrate simultaneously on capacitor C1.

Rolling Reset Integration

The rolling reset integration mode for Pixel Circuit #2 is essentially the same as for Pixel #1. The transfer gate $T_X$ is kept always open for this integration mode. The rolling reset integration mode is implemented by keeping the integration switch always opened ($\Delta V_{INT}=V_{INTCTL}-V_{CASCODE}=1$ V) to enable the photodiode current $I_o$ to flow continuously to the integration capacitors C1 and C2. The rolling reset integration is then implemented in the same manner as a conventional 3T (source follower transistor $T_{SF}$, select transistor $T_{SEL}$, and reset transistor $T_{RST}$) pixel circuit.

Correlated Double Sampling Integration

The CDS integration mode for Pixel Circuit #2, displayed in FIG. 5, is essentially the same as for Pixel #1. The transfer gate $T_X$ is kept always open for this integration mode. The reset switches $T_{RST1}$ and $T_{RST2}$ are opened, while keeping the integration switch closed ($\Delta V_{INT}=V_{INTCTL}-V_{CASCODE}=-1$ V). The initial charge on the integration capacitor $C_{INT}$ (after opening the reset switches $T_{RST1}$ and $T_{RST2}$) is the kTC (switching noise) charge (randomly different on each pixel). The kTC charges on all of the pixels are progressively readout row-by-row, digitized, and stored off-chip. Then the integration switch is opened to enable the photodiode current $I_o$ to flow to the integration capacitors C1 and C2. After an integration time $T_{INT}$, the integration switch is closed ($\Delta V_{INT}=V_{INTCTL}-V_{CASCODE}=-1$ V) to stop collection of charge on the integration capacitors C1 and C2 and to direct the photodiode current $I_o$ directly to the power supply. The final charge on each pixel is the signal (S) plus kTC charge. The charges S+kTC on all of the pixels are then progressively readout row-by-row, digitized, and stored off-chip. The two pixel images S+kTC and kTC are then digitally subtracted (S+kTC−kTC=S) to provide an image with the kTC noise removed.

Pixel Readout Noise

Figure 7:
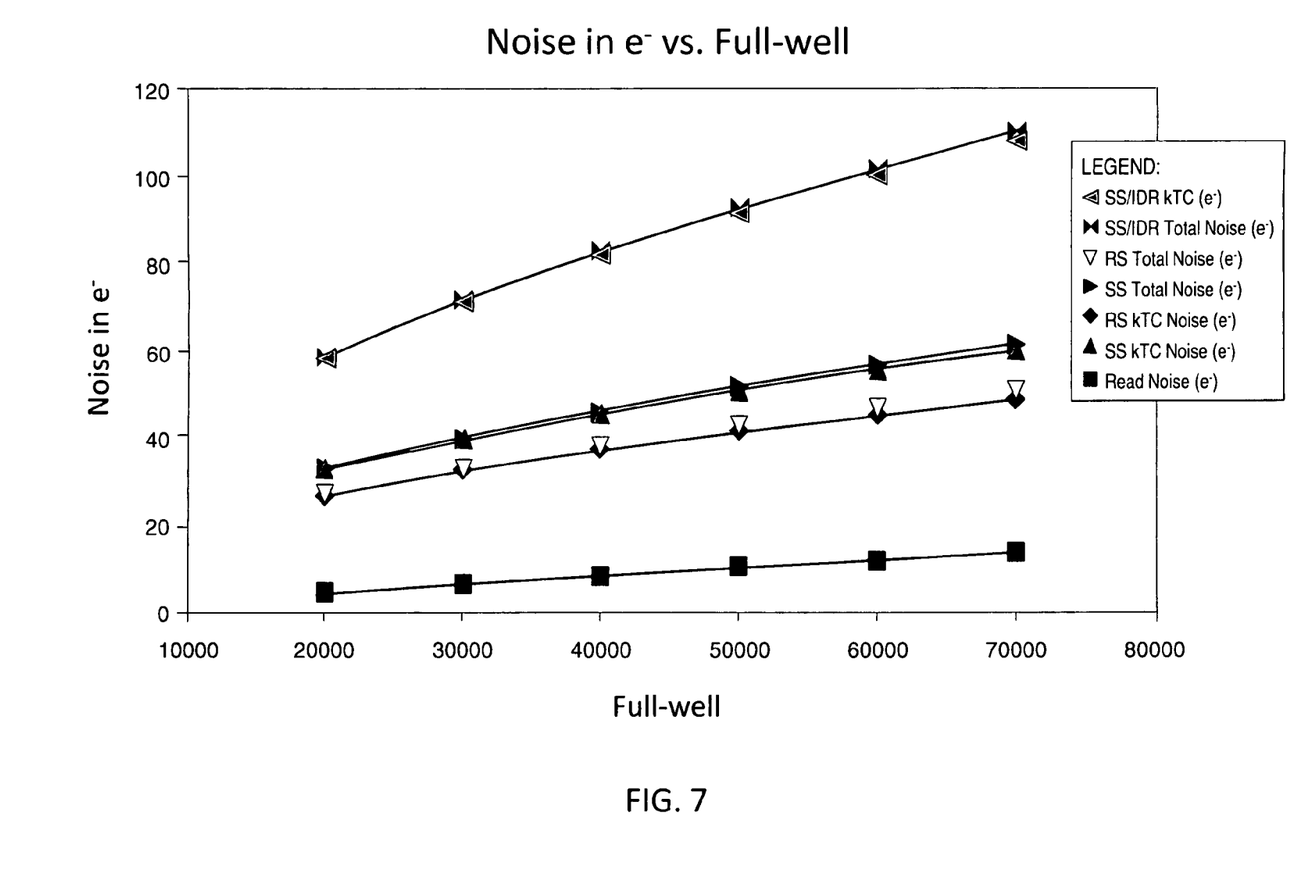
FIG. 7 shows noise simulations.

Noise simulations for the pixel circuits and integration modes are displayed in FIG. 7. The snapshot integrate-while-read mode produces the most noise due to the added kTC noise incurred by the extra storage capacitor.

While there have been shown what are presently considered to be preferred embodiments of the present invention, it will be apparent to those skilled in the art that various changes and modifications can be made herein without departing from the scope and spirit of the invention.

For example, the polarity of the photodiode layer could be reversed so that electrons are collected on the pixel electrodes during pixel integration. Thus, the scope of the invention is to be determined by the appended claims and their legal equivalents.

We claim:

1. A snapshot capable pixel circuit for minimizing leakage current in an imaging sensor, said pixel circuit comprising:
   A) a detector sub-circuit comprising direct injection transistor and a photodiode or a photodiode region of a photodiode layer;
   B) a readout sub-circuit comprising:
      1) an integrating capacitor,
      2) a reset transistor,
      3) a source follower transistor, and
      4) a row select transistor;
   C) a low-voltage power supply,
   D) and integration switch comprising a two-pole integration switch adapted to alternately conduct current between:
      (1) the photodiode or the photodiode region of the photodiode layer and
      (2) either the integrating capacitor or the low-voltage power supply.

2. A pixel circuit as in claim 1 adapted to permit integrate-then-read capability and also integrate-while read capability and further comprising an integrating-storage capacitor and a transfer gate transistor.

* * * * *